(12) United States Patent
Choi

(10) Patent No.: US 8,890,832 B2
(45) Date of Patent: Nov. 18, 2014

(54) DISPLAY DEVICE

(71) Applicant: Howon Choi, Daegu (KR)

(72) Inventor: Howon Choi, Daegu (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 14/151,611

(22) Filed: Jan. 9, 2014

(65) Prior Publication Data

US 2014/0125888 A1 May 8, 2014

Related U.S. Application Data

(62) Division of application No. 12/641,939, filed on Dec. 18, 2009, now Pat. No. 8,643,610.

(30) Foreign Application Priority Data

Apr. 30, 2009 (KR) ........................ 10-2009-0038376

(51) Int. Cl.
G06F 3/041 (2006.01)
G02F 1/1333 (2006.01)
G06F 3/044 (2006.01)
G06F 3/045 (2006.01)
H01L 27/32 (2006.01)

(52) U.S. Cl.
CPC .......... *G02F 1/13338* (2013.01); *G06F 3/0412* (2013.01); *G06F 3/044* (2013.01); *G06F 3/045* (2013.01); *H01L 27/323* (2013.01)
USPC ........................................................ 345/173

(58) Field of Classification Search
USPC ........................................................ 345/173
See application file for complete search history.

(56) References Cited

U.S. PATENT DOCUMENTS

| 5,757,450 A | 5/1998 | Fujii et al. |
| 6,902,658 B2 | 6/2005 | Talin et al. |
| 6,947,102 B2 | 9/2005 | den Boer et al. |
| 2007/0269936 A1 | 11/2007 | Tanaka et al. |
| 2012/0268423 A1 | 10/2012 | Hotelling et al. |

*Primary Examiner* — Van Chow
(74) *Attorney, Agent, or Firm* — Morgan, Lewis & Bockius LLP

(57) ABSTRACT

An embodiment of this document provides a display device comprising a panel, a touch screen panel, and a sense unit. The panel comprises subpixels placed in a display region defined in one face of a first substrate and a second substrate bonded with the first substrate. The touch screen panel is placed on the panel and configured to comprise electrode units. The sense unit is coupled to the electrode units and configured to sense a position through the electrode units. At least some of the electrode units are formed of a multi-layer with heterogeneous metals.

3 Claims, 16 Drawing Sheets

DISPLAY DEVICE

This application is a divisional of copending U.S. patent application Ser. No. 12/641,939 and claims priority under 35 U.S.C. 119 and 35 U.S.C. 365 to Korean Patent Application No. 10-2009-0038376 filed on Apr. 30, 2009, which are hereby incorporated by reference in their entirety.

BACKGROUND

1. Field

This document relates to a display device.

2. Related Art

With the development of information technology, the market for display devices (i.e., media connecting users and information) is growing. In line with this trend, the use of flat panel displays (FPDs), such as a liquid crystal display (LCD) device, an organic light emitting diode (OLED) display device, and a plasma display panel (PDP), is increasing.

Some of the display devices are driven by transistors formed on a substrate in a matrix form, thereby being capable of displaying images. The transistor may comprise a gate, a semiconductor layer, a source, and a drain.

Meanwhile, the display devices are being widely used for various purposes ranging from the home appliance field, such as television (TV) or video, to the industry field, such as computers. Recently, active research is being carried out on the supplement of a touch screen function to the display devices.

SUMMARY

An aspect of this document is to provide a display device comprising a panel, a touch screen panel, and a sense unit. The panel comprises subpixels placed in a display region defined in one face of a first substrate and a second substrate bonded with the first substrate. The touch screen panel is placed on the panel and configured to comprise electrode units. The sense unit is coupled to the electrode units and configured to sense a position through the electrode units. At least some of the electrode units are formed of a multi-layer with heterogeneous metals.

Another aspect of this document is to provide a display device comprising a panel, electrode units, and a sense unit. The panel comprises subpixels placed in a display region defined in one face of a first substrate and a second substrate bonded with the first substrate. The subpixels are covered with an interlayer film. The electrode units comprise first electrodes placed on the interlayer film and second electrodes placed on one face of the second substrate. The subpixels and the one face of the second substrate face each other. The sense unit is coupled to the electrode units and configured to sense a position through the electrode units. At least some of the electrode units are formed of a multi-layer with heterogeneous metals.

Yet another aspect of this document is to provide a panel and a sense unit. The panel comprises subpixels placed in a display region defined between one face of a first substrate and one face of a second substrate and electrode units placed in the second substrate. The sense unit is coupled to the electrode units and configured to sense a position through the electrode units. At least some of the electrode units are formed of a multi-layer with heterogeneous metals.

BRIEF DESCRIPTION OF THE DRAWINGS

The accompany drawings, which are included to provide a further understanding of this document and are incorporated on and constitute a part of this specification illustrate embodiments of this document and together with the description serve to explain the principles of this document.

DETAILED DESCRIPTION

Reference will now be made in detail to embodiments of this document, examples of which are illustrated in the accompanying drawings.

First Embodiment

Figure 1:
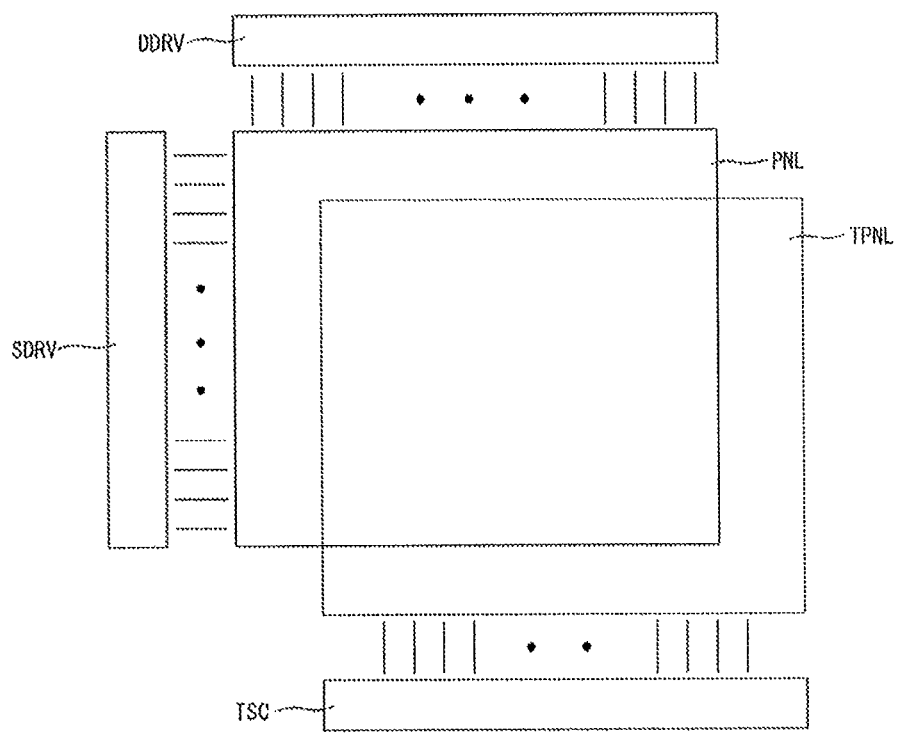
FIG. 1 is a schematic block diagram of a display device according to a first embodiment of this document.

Referring to FIG. 1, a display device comprises a panel PNL, a touch screen panel TPNL, a scan driver SDRV, a data driver DDRV, and a sense unit TSC.

The panel PNL may comprise a FPD, such as an organic light emitting diode display panel, a liquid crystal display panel, or a PDP. In the embodiment, the organic light emitting diode display panel is taken as an example. The scan driver SDRV supplies scan signals to subpixels comprised in the panel PNL. The data driver DDRV supplies data signals to the subpixels comprised in the panel PNL. The touch screen panel TPNL is placed on the panel PNL and is configured to comprise electrode units. The sense unit TSC is coupled to the electrode units and is configured to sense a position through the electrode units when a user touches the touch screen panel TPNL. The sense unit TSC may have a capacitive type using a change in the capacitance (i.e., a change in the capacitance according to the dielectric constant) or a resistive type using a change in the resistance according to the structure of the electrode units formed in the touch screen panel TPNL.

Figure 2:
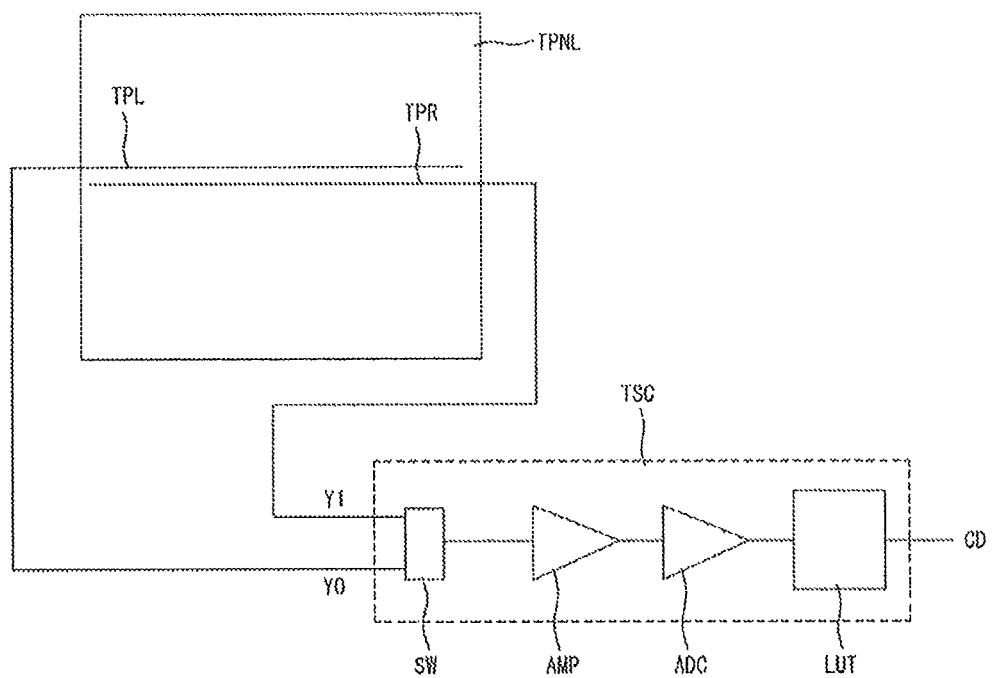
FIG. 2 is a block diagram of a capacitive-type sense unit.

Referring to FIG. 2, the capacitive-type sense unit TSC is coupled to electrode units TPL and TPR placed within the touch screen panel TPNL. When a user touches the touch screen panel TPNL, the sense unit TSC can sense a touched position by recognizing a change in the capacitances of the electrode units TPL and TPR placed within the touch screen panel TPNL.

For example, the sense unit TSC may comprise a signal input unit SW, a signal amplification unit AMP, a signal conversion unit ADC, and a signal detection unit LUT, but not limited thereto. The signal input unit SW receives signals through wiring lines Y0 and Y1 coupled to the electrode units TPL and TPR placed within the touch screen panel TPNL. The signal amplification unit AMP amplifies the signals received from the signal input unit SW. The signal conversion unit ADC converts the inputted analog signals into digital signals. The signal detection unit LUT detects position data by recognizing a change in the capacitance in order to determine which region has been touched by the user based on the digitally converted signals and transfers the detected position data to an apparatus CD.

As described above, the sense unit TSC can detect a touched position by recognizing a change in the capacitances of the electrode units TPL and TPR placed within the touch screen panel TPNL. The electrode units TPL and TPR may have the following structure.

Figure 3:
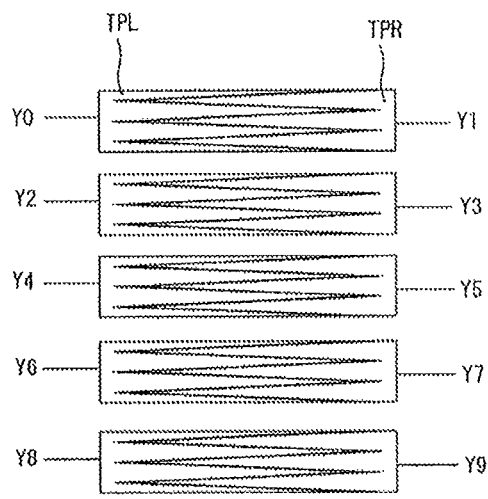
FIGS. 3 and 4 are exemplary diagrams showing the structure of electrode units placed within a touch screen panel.
Figure 4:
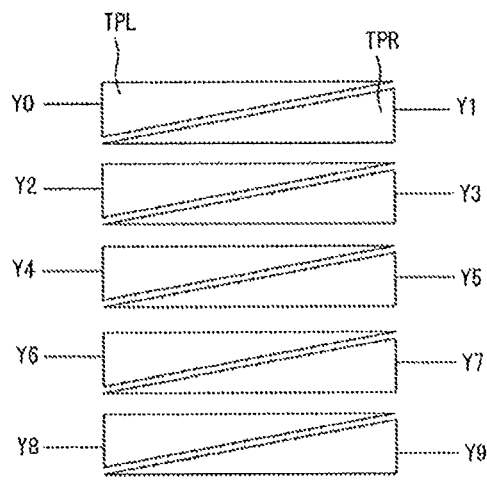

Referring to FIGS. 3 and 4, the electrode units TPL and TPR may comprise first electrodes TPL arranged from the left to the right of the touch screen panel TPNL and second electrodes TPR arranged from the right to the left of the touch screen panel TPNL. Although the first electrodes TPL and the second electrodes TPR are illustrated to be placed at the same layer, they may be patterned in one direction in such a way as to be spaced apart from each other at a constant interval. Further, the first electrodes TPL and the second electrodes TPR may be patterned such that they have different capacitances. The electrode units TPL and TPR may be coupled to the sense unit TSC through wiring lines Y0, . . . , Y9. FIGS. 3 and 4 are only illustrative in order to help understanding of the shapes of the electrode units TPL and TPR, and this document is not limited to the shapes of FIGS. 3 and 4.

The structure of the organic light emitting diode display device having the capacitive-type touch screen panel according to the first embodiment of this document is described below.

Figure 5:
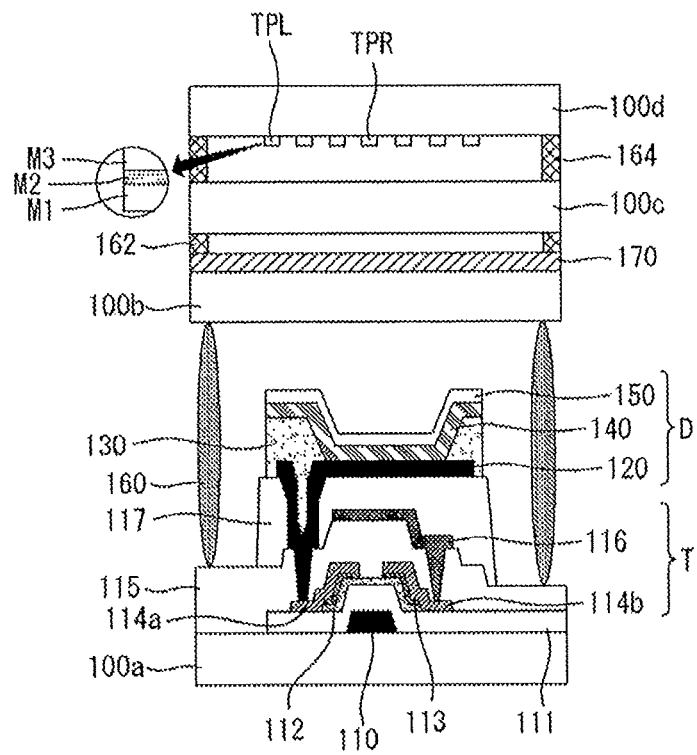
FIG. 5 shows a schematic structure of an organic light emitting diode display device having a capacitive-type touch screen panel according to a first embodiment.

Referring to FIG. 5, the panel comprises a subpixel placed between a first substrate 100a and a second substrate 100b. The subpixel comprises a switching transistor driven in response to a scan signal, a capacitor configured to store a data signal in the form of a data voltage, a driving transistor driven by the data voltage stored in the capacitor, and an organic light emitting diode configured to emit light when the driving transistor is driven. When the scan signal and the data signal are received from the scan driver and the data driver, the subpixel emits light. The panel can represent an image corresponding thereto. In view of the characteristic of the drawing, the cross section of the driving transistor T and the organic light emitting diode D, from among the elements comprised in the subpixel, is shown in the drawing of the panel. The subpixel comprised in the panel is described below.

A gate 110 is placed on one face of the first substrate 100a. The gate 110 may be made of any one selected from the group consisting of molybdenum (Mo), aluminum (Al), chrome (Cr), gold (Au), titanium (Ti), nickel (Ni), neodymium (Nd), and copper (Cu) or an alloy of them. Alternatively, the gate 110 may be a multi-layer that is made of any one selected from the group consisting of molybdenum (Mo), aluminum (Al), chrome (Cr), gold (Au), titanium (Ti), nickel (Ni), neodymium (Nd), and copper (Cu) or an alloy of them. Alternatively, the gate 110 may be a dual layer of Mo/Al—Nd or Mo/Al.

A first insulating layer 111 is placed on the gate 110. The first insulating layer 111 may be formed of a silicon oxide (SiOx) layer, a silicon nitride (SiNx) layer or a multi-layer of them, but not limited thereto.

An active layer 112 is placed on the first insulating layer 111. The active layer 112 may comprise amorphous silicon or crystallized polysilicon. The active layer 112 may comprise a source region, a channel region, and a drain region. Further, an ohmic contact layer 113 may be placed on the active layer 112.

A source 114a and a drain 114b respectively coupled to the source and drain regions of the active layer 112 are placed on the ohmic contact layer 113. The source 114a and the drain 114b may be a single layer or a multi-layer. In the case where the source 114a and the drain 114b are formed of a single layer, they may be made of any one selected from the group consisting of molybdenum (Mo), aluminum (Al), chrome (Cr), gold (Au), titanium (Ti), nickel (Ni), neodymium (Nd), and copper (Cu) or an alloy of them. Meanwhile, in the case where the source 114a and the drain 114b are formed of a multi-layer, they may have a dual layer of Mo/Al—Nd or a triple layer of Mo/Al/Mo or Mo/Al—Nd/Mo.

A second insulating layer 115 is placed on the source 114a and the drain 114b. The second insulating layer 115 may be formed of a silicon oxide (SiOx) layer, a silicon nitride (SiNx) layer or a multi-layer of them, but not limited thereto.

A shield metal 116 may be placed on the second insulating layer 115. The shield metal 116 may be coupled to the source 114a or the drain 114b, and it may function to protect the transistors from external interference.

A third insulating layer 117 is placed on the second insulating layer 115. The third insulating layer 117 may be formed of a silicon oxide (SiOx) layer, a silicon nitride (SiNx) layer or a multi-layer of them, but not limited thereto.

A lower electrode 120 coupled to the source 114a or the drain 114b is placed on the third insulating layer 117. The lower electrode 120 can be selected as a cathode or an anode. In the case where the lower electrode 120 is selected as the cathode, the cathode may be made of any one of aluminum (Al), an Al alloy, and AlNd, but not limited thereto. Further, in the case where the lower electrode 120 is selected as the cathode, the cathode advantageously is made of materials having a high reflectance.

A bank layer 130 having an opening portion through which part of the lower electrode 120 is exposed is placed on the lower electrode 120. The bank layer 130 may comprise organic matter, such as benzocyclobutene (BCB) series resin, acrylic series resin, or polyimide resin, but not limited thereto.

Figure 6:
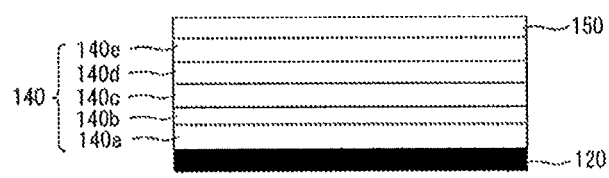
FIG. 6 shows a hierarchical structure of an organic light emitting diode.

An organic light emitting layer 140 is placed on the lower electrode 120. The organic light emitting layer 140 may comprise a hole injection layer, a hole transport layer, a light emitting layer, an electron transport layer, and an electron injection layer. Referring to FIG. 6, the hole injection layer 140a may function to make smooth the injection of holes. The hole injection layer 140a may be made of any one or more selected from the group consisting of CuPc (copper phthalocyanine), PEDOT (poly(3,4)-ethylenedioxythiophene), PANI (polyaniline), and NPD (N,N-dinaphthyl-N,N'-diphenyl benzidine), but not limited thereto. The hole transport layer 140b may function to make smooth the transport of electrons. The hole transport layer 140b may be made of any one or more selected from the group consisting of NPD (N,N-dinaphthyl-N,N'-diphenyl benzidine), TPD (N,N'-bis-(3-methylphenyl)-N,N'-bis-(phenyl)-benzidine), s-TAD, and MTDATA (4,4',4''-Tris(N-3-methylphenyl-N-phenyl-amino)-triphenylamine), but not limited thereto. The light emitting layer 140c may comprise materials that emit red, green, blue, and white, and it may be made of phosphorescent or fluorescent materials. In the case where the light emitting layer 140c may be made of a material that emits red light, the light emitting layer 140c may be made of a phosphorescent material, comprising a host material comprising carbazole biphenyl (CBP) or 1,3-bis(carbazol-9-yl) (mCP) and a dopant material comprising any one or more selected from the group consisting of PIQIr (acac)(bis(1-phenylisoquinoline)acetylacetonate iridium), PQIr (acac)(bis(1-phenylquinoline) acetylacetonate iridium), PQIr (tris(1-phenylquinoline)iridium), and PtOEP (octaethylporphyrin platinum). Alternatively, the light emitting layer 140c may be made of a fluorescent material comprising PBD:Eu(DBM)$_3$(Phen) or perylene, but not limited thereto. In the case where the light emitting layer 140c is made of a material that emits green light, the light emitting layer 140c may be made of a phosphorescent material, comprising a host material comprising CBP or mCP and a dopant material comprising Ir(ppy)3(fac tris(2-phenylpyridine)iridium). Alternatively, the light emitting layer 140c may be made of a fluorescent material comprising Alq3(tris(8-hydroxyquinolino)aluminum), but not limited thereto. In the case where the light emitting layer 140c is made of a material that emits blue light, the light emitting layer 140c may be made of a phosphorescent material, comprising a host material comprising CBP or mCP and a dopant material comprising (4,6-F2 ppy)2Irpic. Alternatively, the light emitting layer 140c may be made of a fluorescent material comprising any one selected from the group consisting of spiro-DPVBi, spiro-6P, distryrylbenzene (DSB), distyrylarylene (DSA), PFO polymer, and PPV polymer, but not limited thereto. The electron transport layer 140d may function to make smooth the transport of electrons. The electron transport layer 140d may be made of any one or more selected from the group consisting of Alq3(tris(8-hydroxyquinolino) aluminum), PBD, TAZ, spiro-PBD, BAlq, and SAlq, but not limited thereto. The electron injection layer 140e may function to make smooth the injection of electrons. The electron injection layer 140e may be made of Alq3(tris(8-hydroxyquinolino)aluminum), PBD, TAZ, spiro-PBD, BAlq, or SAlq, but not limited thereto. It is to be noted that this document is not limited to FIG. 6 and at least one of the hole injection layer 140a, the hole transport layer 140b, the electron transport layer 140d, and the electron injection layer 140e may be omitted.

An upper electrode 150 is placed on the organic light emitting layer 140. The upper electrode 150 can be selected as an anode or a cathode. Here, the upper electrode 150 selected as the anode may be made of any one of indium tin oxide (ITO), indium zinc oxide (IZO), indium tin zinc oxide (ITZO), and ZnO doped Al$_2$O$_3$ (AZO), but not limited thereto.

A plurality of the subpixels is arranged in a matrix form on one face of the first substrate 100a. The subpixels arranged on the one face of the first substrate 100a are vulnerable to moisture or oxygen. Accordingly, the first substrate 100a can be bonded with the second substrate 100b by a first adhesive member 160.

The touch screen panel comprises a third substrate 100c and a fourth substrate 100d adhered to the other face of the second substrate 100b constituting the panel. The third substrate 100c and the fourth substrate 100d coalesced with each other by a second adhesive member 164. The third substrate 100c is adhered to the other face of the second substrate 100b by a third adhesive member 162, and so this touch screen panel can be placed over the panel. In this embodiment, however, an example in which a polarization plate 170 is adhered to the second substrate 100b and the touch screen panel is adhered over the polarization plate 170 is described as an example. The touch screen panel is described below.

The electrode units TPL and TPR are placed on one face of the fourth substrate 100d (i.e., a face opposite to the third substrate 100c). The electrode units TPL and TPR, as described above with reference to FIGS. 3 and 4, may be patterned in various fashions and placed on the one face of the fourth substrate 100d. In FIG. 5, however, an example in which the electrode units TPL and TPR are placed in a form, such as that shown in FIG. 3, is described.

Meanwhile, when the sense unit senses a touched position through the electrode units TPL and TPR placed in the touch screen panel, a sensing time is "τ=RC (resistance, capacitance)" and it becomes fast with a reduction in resistance.

According to the present embodiment, at least some of the electrode units TPL and TPR have a structure having a multilayer made of heterogeneous metals in order to improve the sensing time. In more detail, some or all of each of the electrode units TPL and TPR have a triple structure made of metal oxide (M1)/metal (M2)/metal oxide (M3). Here, the metal (M2) is relatively more thinly formed than the metal oxides (M1 and M3). When the electrode units TPL and TPR are formed as described above, they can have a high transmissivity in the visible region and can implement a low resistance although the metals are inserted into the electrode units TPL and TPR using the plasmon vacuum effect of metals. Table below lists comparison results of light transmissivity and sheet resistance between a comparative example and the embodiment.

TABLE

| | ELECTRODE UNIT STRUCTURE ( ) | LIGHT TRANSMISSIVITY (@550 NM) | SHEET RESISTANCE ($\Omega$ m$^2$) | DEPOSITION METHOD |
|---|---|---|---|---|
| COMPARATIVE EXAMPLE | IZO (1500) | >90% | 25 | counter target sputter (FTS) |

TABLE-continued

| ELECTRODE UNIT STRUCTURE ( ) | LIGHT TRANSMISSIVITY (@550 NM) | SHEET RESISTANCE ($\Omega\,m^2$) | DEPOSITION METHOD |
|---|---|---|---|
| EMBODIMENTS WO$_3$/Ag/WO$_3$ (300/150/300) | 94.5% | 7.12 | thermal evaporation |
| WO$_3$/Au/WO$_3$ (300/150/300) | 56.5% | 7.99 | |
| SnO$_2$/Ag/SnO$_2$ (300/100/300) | 90.16% | 7.3 | |
| MoO$_3$/Ag/MoO$_3$ (300/150/300) | 76.5% | 7.84 | |
| CeO$_2$/Au/CeO$_2$ (300/120/300) | 65.8% | 7.35 | |
| IZO/Ag/IZO (300/100/300) | 91% | 8 | FTS/ thermal evaporation/ FTS |
| IZO/Ag/IZO (300/120/300) | 92% | 5.9 | |
| IZO/Ag/IZO (300/140/300) | 90% | 4.8 | |
| IZO/Ag/IZO (300/160/300) | 85% | 3.9 | |

In Table, an example in which the structure of the electrode units TPL and TPR is made of any one of tungsten oxide (WO$_3$), gold (Au), silver (Ag), molybdenum oxide (MnO$_3$), cerium oxide (CeO$_2$), and indium zinc oxide (IZO) is listed. The materials constituting the electrode units TPL and TPR are however not limited thereto, but may comprise metal oxide, such as tellurium oxide (TeO$_2$), selenium oxide (SeO$_2$), indium tin oxide (ITO), tin oxide (SnO$_2$), and AZO (Al$_2$O; doped ZnO) and metal, such as aluminum (Al) or copper (Cu).

From Table, it can be seen that, when each of the electrode units TPL and TPP has the metal oxide (M1)/metal (M2)/metal oxide (M3) structure, light transmissivity and sheet resistance are improved as compared to the comparative example. Accordingly, when the electrode units TPL and TPR have the above structure, an electrical property, an optical property, and a transmission characteristic can be satisfied when fabricating the touch screen panel.

Hereinafter, the structure of an organic light emitting diode display device having a resistive-type touch screen panel according to a first embodiment of this document is described.

Figure 7:
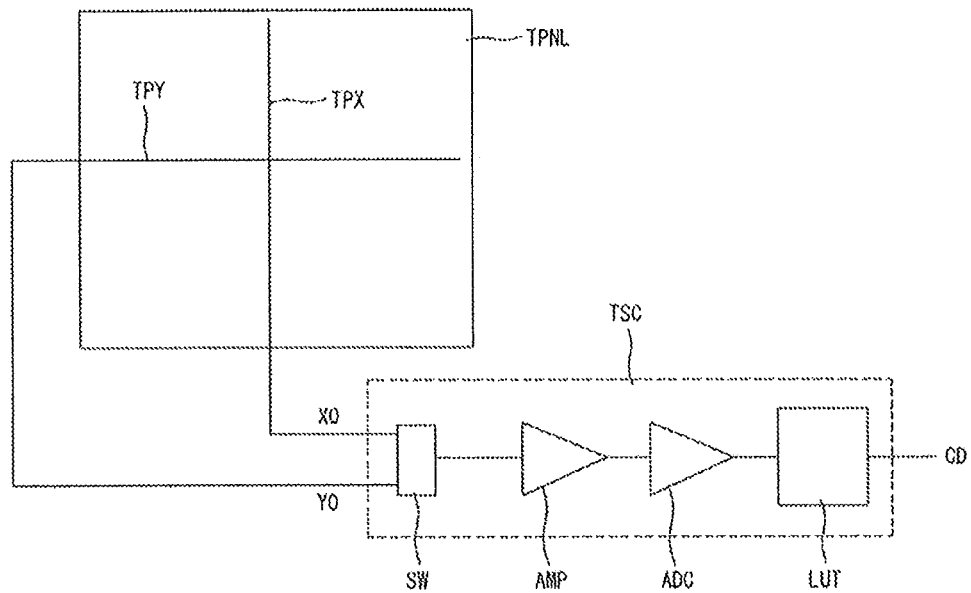
FIG. 7 is a block diagram of a resistive-type sense unit.

Referring to FIG. 7, a resistive-type sense unit TSC is coupled to electrode units TPY and TPX placed within a touch screen panel TPNL. When a user touches the touch screen panel TPNL, the sense unit TSC can sense a touched position by recognizing a change in the resistances of the electrode units TPL and TPR placed within the touch screen panel TPNL.

For example, the sense unit TSC may comprise a signal input unit SW, a signal amplification unit AMP, a signal conversion unit ADC, and a signal detection unit LUT, but not limited thereto. The signal input unit SW receives signals through wiring lines Y0 and X0 coupled to the electrode units TPY and TPX placed within the touch screen panel TPNL. The signal amplification unit AMP amplifies the signals received from the signal input unit SW. The signal conversion unit ADC converts the inputted analog signals into digital signals. The signal detection unit LUT detects position data by recognizing a change in the capacitance in order to determine which region has been touched by the user based on the digitally converted signals and transfers the detected position data to an apparatus CD.

As described above, the resistive-type sense unit TSC can detect a touched position by recognizing a change in the resistances of the electrode units TPY and TPX placed within the touch screen panel TPNL. The electrode units TPY and TPX may have the following structure.

Figure 8:
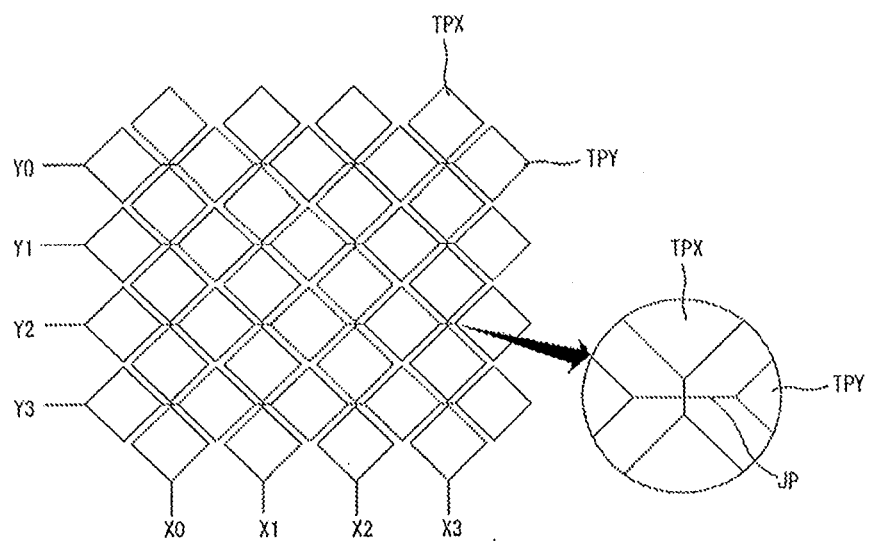
FIG. 8 is an exemplary diagram showing the structure of the electrode units placed within the touch screen panel.

Referring to FIG. 8, the electrode units TPY and TPX may comprise first electrodes TPY arranged in the Y-axis direction and second electrodes TPX arranged in the X-axis direction. The first electrodes TPY and the second electrodes TPX are patterned such that they are placed at different layers, and the patterned electrodes TPY and TPX can be connected by jumper electrodes JP. FIG. 8 is only illustrative in order to help understanding of the shape of the electrode units TPY and TPX, and this document is not limited to the shape of FIG. 8.

Figure 9:
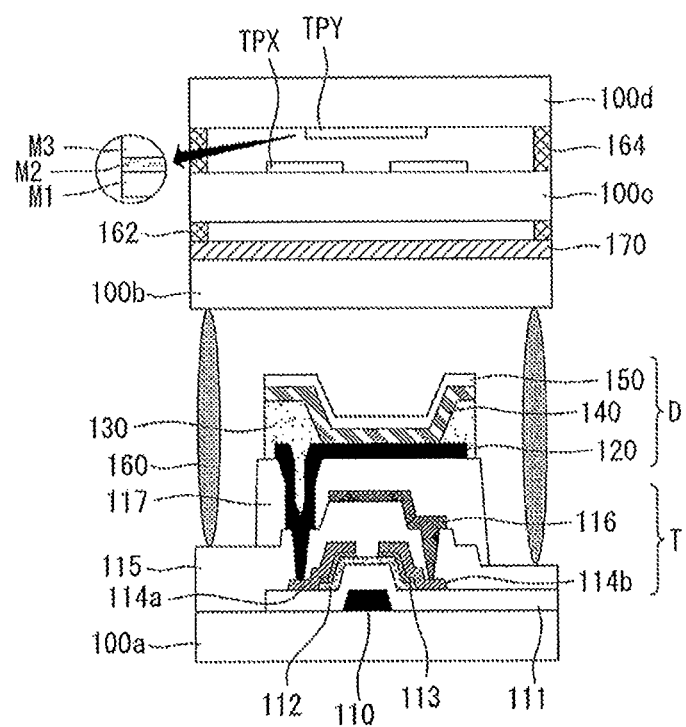
FIG. 9 shows a schematic structure of an organic light emitting diode display device having a resistive-type touch screen panel built therein according to a first embodiment.

Referring to FIG. 9, the panel comprises a subpixel placed between a first substrate 100a and a second substrate 100b. In view of the characteristic of the drawing, the cross section of a driving transistor T and an organic light emitting diode D, from among the elements comprised in the subpixel, is shown in the drawing of the panel. The subpixel comprised in the panel has the same structure as that shown in FIG. 5, and a description thereof is omitted in order to avoid redundancy. The touch screen panel is described below.

The touch screen panel comprises a third substrate 100c and a fourth substrate 100d adhered to the other face of the second substrate 100b constituting the panel. The third substrate 100c and the fourth substrate 100d coalesce with each other by a second adhesive member 164. The third substrate 100c is adhered to the other face of the second substrate 100b by a third adhesive member 162, and so this touch screen panel can be placed over the panel. In this embodiment, however, an example in which a polarization plate 170 is adhered to the second substrate 100b and the touch screen panel is adhered over the polarization plate 170 is described as an example.

The second electrodes TPX are placed on one face of the third substrate 100c, and the first electrodes TPY are placed on one face of the fourth substrate 100d (i.e., face opposite to the third substrate 100c). The electrode units TPY and TPX can be patterned in a form, such as that shown in FIG. 8, or other forms and can be placed on the one faces of the third substrate 100c and the fourth substrate 100d, respectively. In FIG. 9, it is assumed that the electrode units TPY and TPX are placed in the form shown in FIG. 8.

Meanwhile, when the sense unit senses a touched position through the electrode units TPY and TPX placed in the touch screen panel, a sensing time is "τ=RC (resistance, capacitance)". The sensing time becomes fast with a reduction in resistance.

According to the present embodiment, at least some of the electrode units TPY and TPX have a structure having a multi-layer made of heterogeneous metals in order to improve the sensing time. In more detail, some or all of each of the electrode units TPY and TPX has a triple structure made of metal oxide (M1)/metal (M2)/metal oxide (M3). Here, the metal (M2) is relatively more thinly formed than the metal oxides (M1 and M3). When the electrode units TPY and TPX are formed as described above, they can have a high transmissivity in the visible region and can implement a low resistance although the metals are inserted into the electrode units TPY and TPX using the plasmon vacuum effect of metals.

From Table above, it can be seen that, when each of the electrode units TPY and TPX has the metal oxide (M1)/metal (M2)/metal oxide (M3) structure, light transmissivity and sheet resistance are improved as compared to the comparative example. Accordingly, when the electrode units TPY and TPX have the above structure, an electrical property, an optical property, and a transmission characteristic can be satisfied when fabricating the touch screen panel.

Second Embodiment

Figure 10:
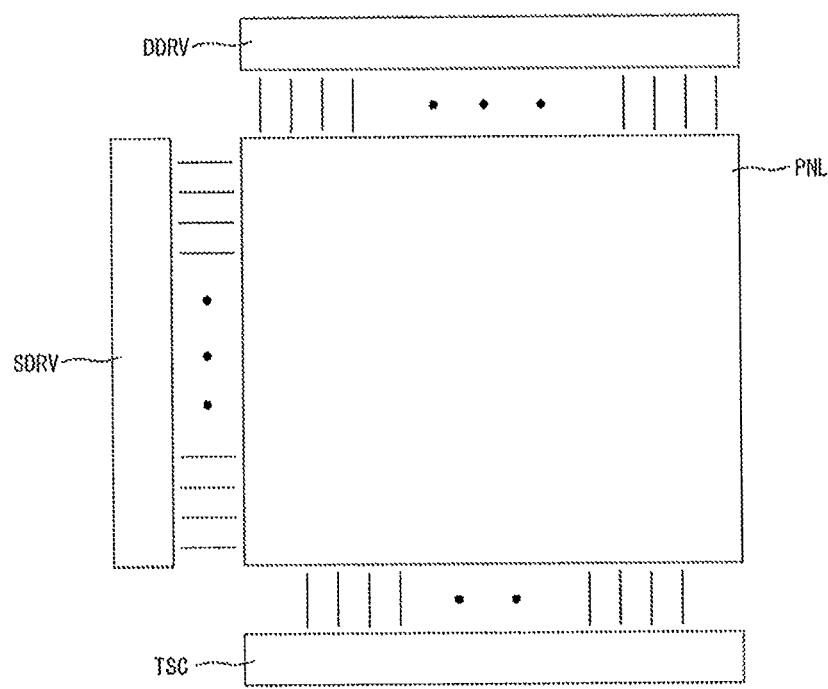
FIG. 10 is a schematic block diagram of a display device according to a second embodiment of this document.

Referring to FIG. 10, a display device comprises a panel PNL, a scan driver SDRV, a data driver DDRV, and a sense unit TSC.

The panel PNL may comprise a FPD, such as an organic light emitting diode display panel, a liquid crystal display panel, or a PDP. In the embodiment, the organic light emitting diode display panel is taken as an example. The panel PNL comprises subpixels and electrode units. The scan driver SDRV supplies scan signals to the subpixels comprised in the panel PNL. The data driver DDRV supplies data signals to the subpixels comprised in the panel PNL. The sense unit TSC is coupled to the electrode units and is configured to sense a position through the electrode units when a user touches the panel PNL. The sense unit TSC may have a capacitive type using a change in the capacitance (i.e., a change in the capacitance according to the dielectric constant) or a resistive type using a change in the resistance according to the structure of the electrode units formed in the panel PNL.

Figure 11:
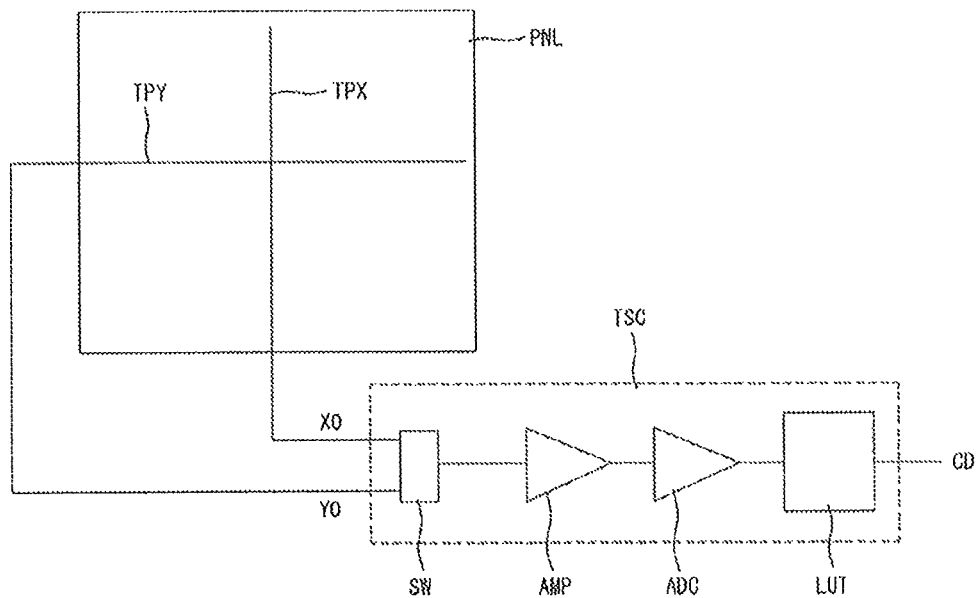
FIG. 11 is a block diagram of a sense unit.

Referring to FIG. 11, the sense unit TSC is coupled to the electrode units TPY and TPX placed within the panel PNL. When a user touches the panel PNL, the sense unit TSC can sense a touched position by recognizing a change in the capacitances or a change in the resistances of the electrode units TPY and TPX placed within the panel PNL.

For example, the sense unit TSC may comprise a signal input unit SW, a signal amplification unit AMP, a signal conversion unit ADC, and a signal detection unit LUT, but not limited thereto. The signal input unit SW receives signals through wiring lines Y0 and X0 coupled to the electrode units TPY and TPX placed within the panel PNL. The signal amplification unit AMP amplifies the signals received from the signal input unit SW. The signal conversion unit ADC converts the inputted analog signals into digital signals. The signal detection unit LUT detects position data by recognizing a change in the capacitance or a change in the resistance in order to determine which region has been touched by the user based on the digitally converted signals and transfers the detected position data to an apparatus CD.

As described above, the sense unit TSC can detect a touched position by recognizing a change in the capacitances or a change in the resistances of the electrode units TPY and TPX placed within the panel PNL. The electrode units TPY and TPX may have the following structure.

Figure 12:
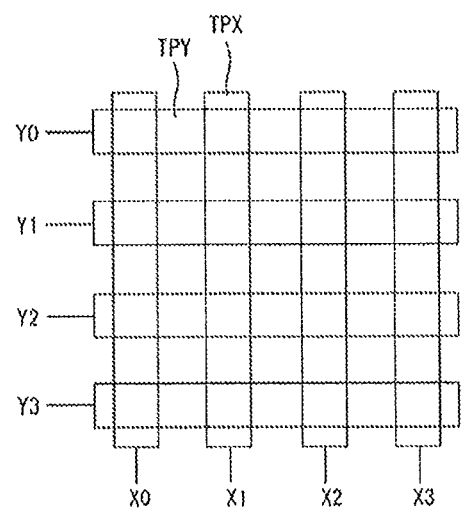
FIGS. 12 to 15 are exemplary diagrams showing the structure of electrode units placed within a panel.

Referring to FIG. 12, the electrode units TPY and TPX may comprise first electrodes TPY arranged in the Y-axis direction and second electrodes TPX arranged in the X-axis direction. The first electrodes TPY and the second electrodes TPX may be patterned such that they are placed at different layers. The electrode units TPY and TPX may be coupled to the sense unit TSC through wiring lines Y0, . . . , Y3 and X0, . . . , X3, respectively.

Figure 13:
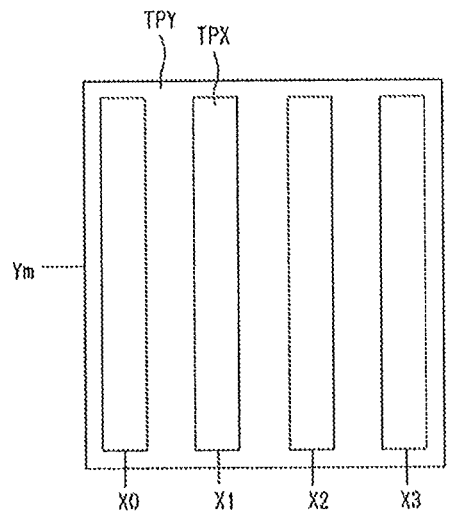

For example, referring to FIG. 13, the electrode units TPY and TPX may comprise the first electrodes TPY arranged in common and the second electrodes TPX arranged in the X-axis direction. The first electrodes TPY and the second electrodes TPX may be patterned such that they are placed at different layers. The electrode units TPY and TPX may be coupled to the sense unit TSC through the wiring lines Ym and X0, . . . , X3, respectively.

Figure 14:
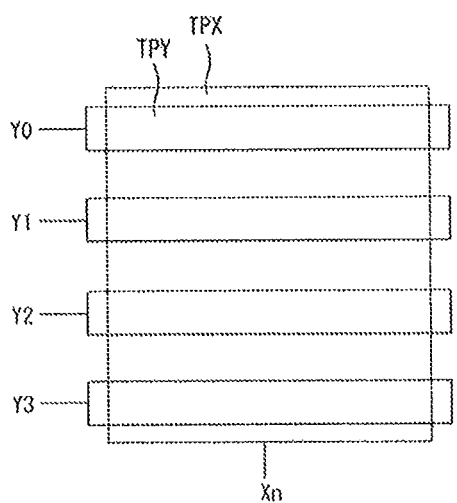

For example, referring to FIG. 14, the electrode units TPY and TPX may comprise the first electrodes TPY arranged in the Y-axis direction and the second electrodes TPX arranged in common. The first electrodes TPY and the second electrodes TPX may be patterned such that they are placed at different layers. The electrode units TPY and TPX may be coupled to the sense unit TSC through the wiring lines Y0, . . . , Y3 and Xn, respectively.

Figure 15:
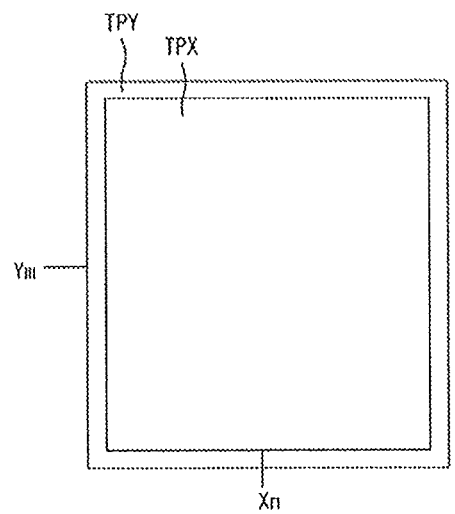

For example, referring to FIG. 15, the electrode units TPY and TPX may comprise the first electrodes TPY arranged in common and the second electrodes TPX arranged in common. The first electrodes TPY and the second electrodes TPX may be patterned such that they are placed at different layers. The electrode units TPY and TPX may be coupled to the sense unit TSC through the wiring lines Ym and Xn, respectively. FIGS. 12 to 15 are only illustrative in order to help understanding of the shapes of the electrode units TPY and TPX, and this document is not limited to the shapes of FIGS. 12 to 15.

The structure of the organic light emitting diode display device having the panel according to the second embodiment of this document is described below.

Figure 16:
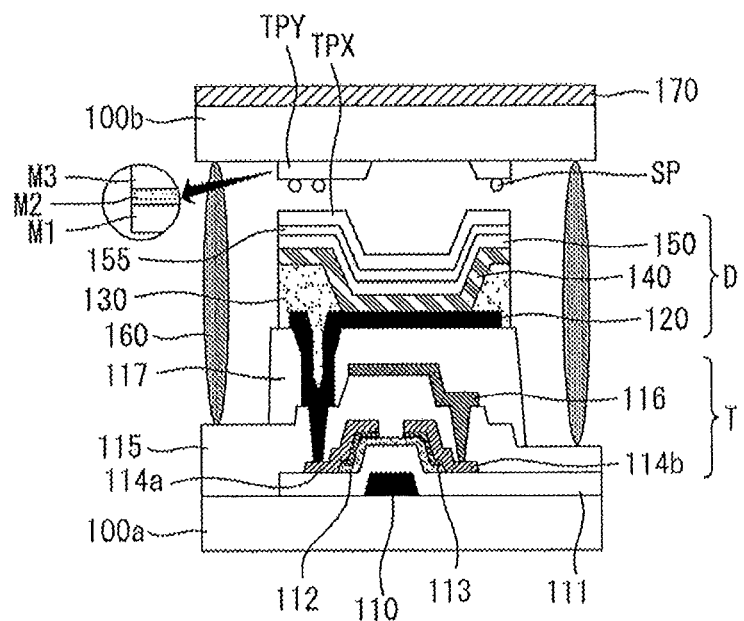
FIGS. 16 and 17 show schematic structures of an organic light emitting diode display device having a resistive-type touch screen panel built therein according to a second embodiment of this document.
Figure 17:
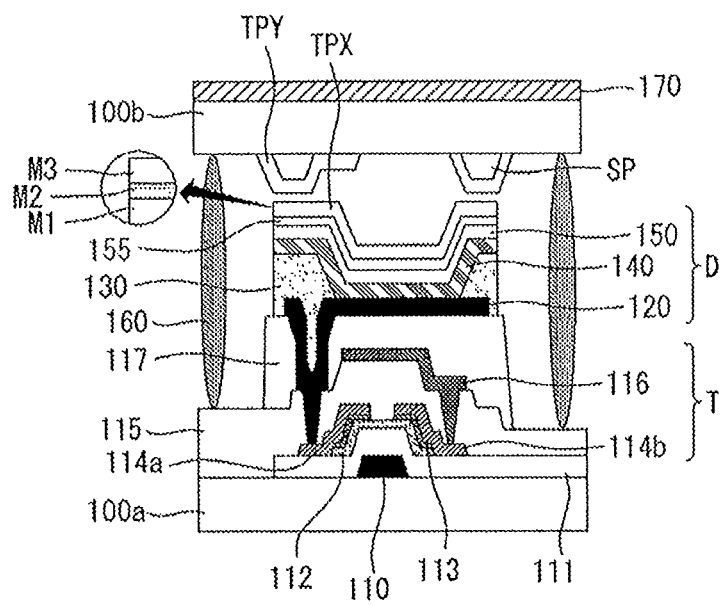

Referring to FIGS. 16 and 17, the panel comprises a subpixel placed between a first substrate 100a and a second substrate 100b. In view of the characteristic of the drawings, the cross section of a driving transistor T and an organic light emitting diode D, from among the elements comprised in the subpixel, is shown in the drawings of the panel. The subpixel comprised in the panel has a similar structure to that shown in FIG. 5. In this case, however, an interlayer film 155 is placed on the upper electrode 150 of the subpixel such that a touch screen panel can be configured within the panel.

A touch screen panel comprises the second electrodes TPX placed on the interlayer film 155 of the subpixel formed within the panel and the first electrodes TPY placed on one face of the second substrate 100b (i.e., a face opposite to the subpixel), and it is formed within the panel. In this embodiment, a polarization plate 170 may be adhered to the other face of the second substrate 100b. The electrode units TPY and TPX can be patterned to have any one of forms, such as those shown in FIGS. 12 to 15, or other forms and can be placed on the interlayer film 155 and on one face of the second substrate 100b, respectively.

The present embodiment illustrates that the resistive-type touch screen panel is configured within the panel. If the touch screen panel is configured to have the resistive type, a change in the resistance is generated by contact of the first electrodes TPY and the second electrodes TPX. Accordingly, spacers SP can be formed between the first electrodes TPY and the second electrodes TPX in order to facilitate the contact, as shown in FIG. 16, or spacers SP can be formed between the first electrodes TPY and the second substrate 100b in order to facilitate the contact, as shown in FIG. 17.

Meanwhile, when the sense unit senses a touched position through the electrode units TPY and TPX placed in the touch screen panel, a sensing time is "$\tau=PC$ (resistance, capacitance)". The sensing time becomes fast with a reduction in resistance.

According to the present embodiment, at least some of the electrode units TPY and TPX have a structure having a multilayer made of heterogeneous metals in order to improve the sensing time. In more detail, some or all of each of the electrode units TPY and TPX can have a triple structure made of metal oxide (M1)/metal (M2)/metal oxide (M3). Here, the metal (M2) is relatively more thinly formed than the metal oxides (M1 and M3). When the electrode units TPY and TPX are formed as described above, they can have a high transmissivity in the visible region and can implement a low resistance although the metals are inserted into the electrode units TPY and TPX using the plasmon vacuum effect of metals.

From Table above described in the first or second embodiment, it can be seen that, when each of the electrode units TPY and TPX has the metal oxide (M1)/metal (M2)/metal oxide (M3) structure, light transmissivity and sheet resistance are improved as compared with the comparative example. Accordingly, when the electrode units TPY and TPX have the above structure, an electrical property, an optical property, and a transmission characteristic can be satisfied when fabricating the touch screen panel.

Third Embodiment

Figure 18:
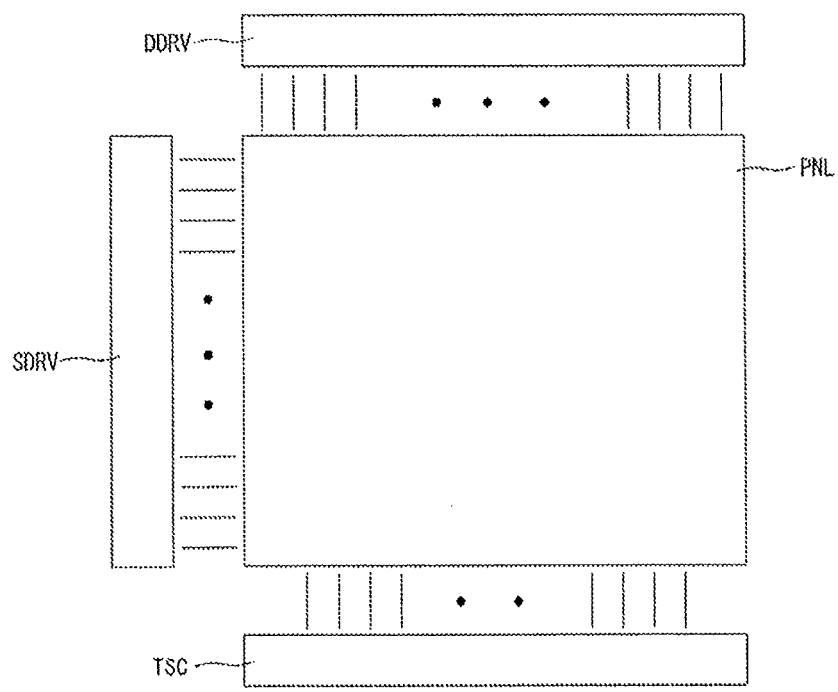
FIG. 18 is a schematic block diagram of a display device according to a third embodiment of this document.

Referring to FIG. 18, a display device comprises a panel PNL, a scan driver SDRV, a data driver DDRV, and a sense unit TSC.

The panel PNL may comprise a FPD, such as an organic light emitting diode display panel, a liquid crystal display panel, or a PDP. In the embodiment, the organic light emitting diode display panel is taken as an example. The panel PNL comprises subpixels and electrode units. The scan driver SDRV supplies scan signals to the subpixels comprised in the panel PNL. The data driver DDRV supplies data signals to the subpixels comprised in the panel PNL. The sense unit TSC is coupled to the electrode units and is configured to sense a position through the electrode units when a user touches the panel PNL. The sense unit TSC is coupled to the electrode units formed in the panel PNL and is configured to have a capacitive type using a change in the capacitance (i.e., a change in the capacitance according to the dielectric constant).

Figure 19:
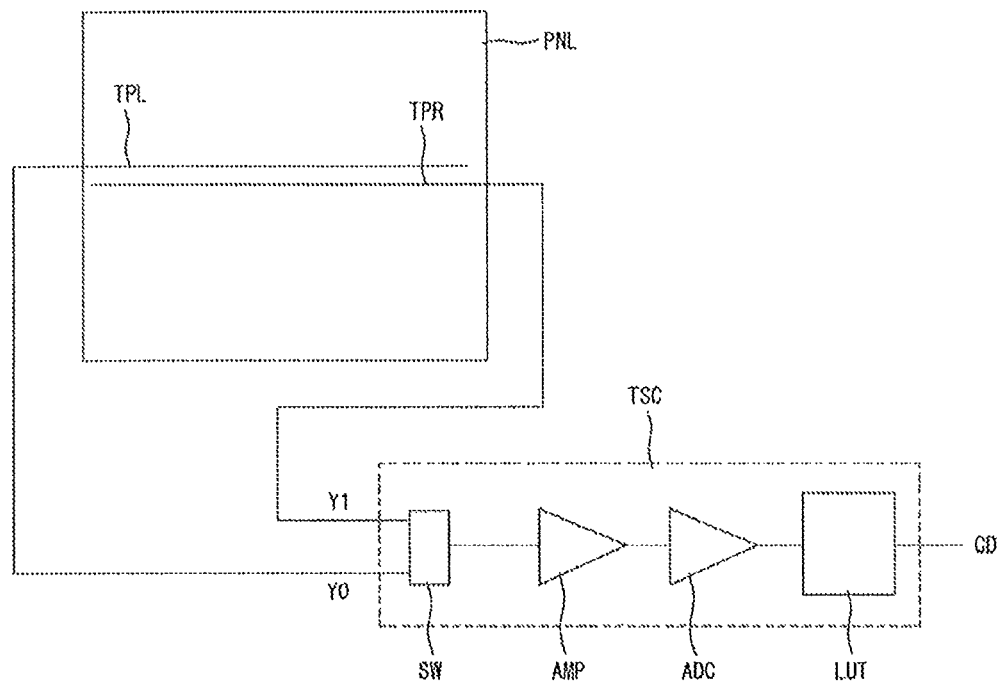
FIG. 19 is a block diagram of a capacitive-type sense unit.

Referring to FIG. 19, the capacitive-type sense unit TSC is coupled to the electrode units TPL and TPR placed within the panel PNL. When a user touches the panel PNL, the sense unit TSC can sense a touched position by recognizing a change in the capacitances of the electrode units TPL and TPR placed within the panel PNL.

For example, the sense unit TSC may comprise a signal input unit SW, a signal amplification unit AMP, a signal conversion unit ADC, and a signal detection unit LUT, but not limited thereto. The signal input unit SW receives signals through wiring lines Y0 and Y1 coupled to the electrode units TPL and TPR placed within the panel PNL. The signal amplification unit AMP amplifies the signals received from the signal input unit SW. The signal conversion unit ADC converts the inputted analog signals into digital signals. The signal detection unit LUT detects position data by recognizing a change in the capacitance in order to determine which region has been touched by the user based on the digitally converted signals and transfers the detected position data to an apparatus CD.

As described above, the sense unit TSC can detect a touched position by recognizing a change in the capacitances of the electrode units TPL and TPR placed within the panel PNL. The electrode units TPL and TPR may have the following structure.

Figure 20:
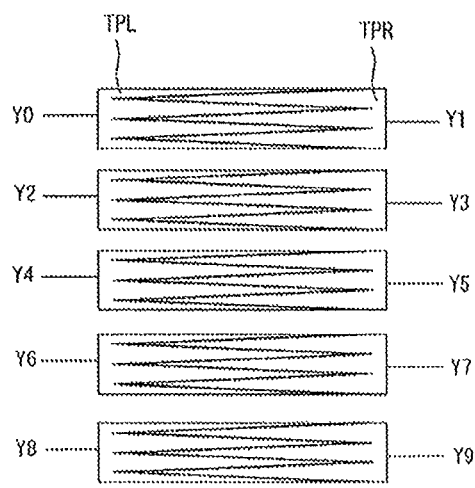
FIGS. 20 and 21 are exemplary diagrams showing the structure of electrode units placed within a panel.
Figure 21:
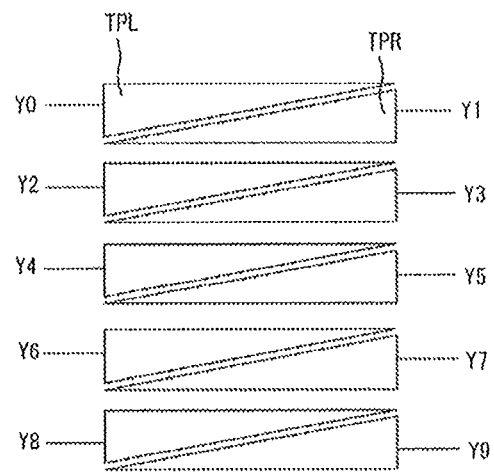

Referring to FIGS. 20 and 21, the electrode units TPL and TPR may comprise first electrodes TPL arranged from the left to the right and second electrodes TPR arranged from the right to the left. The first electrodes TPL and the second electrodes TPR are illustrated to be placed at the same layer, but may be patterned in one direction such that they are spaced apart from each other at a regular interval. Further, the first electrodes TPL and the second electrodes TPR, as shown, may be patterned to have different capacitances. The electrode units TPL and TPR may be coupled to the sense unit TSC through wiring lines Y0, . . . , Y9. FIGS. 20 and 21 are only illustrative in order to help understanding of the shapes of the electrode units TPY and TPX, and this document is not limited to the shapes of FIGS. 20 to 21.

The structure of the organic light emitting diode display device having a capacitive-type touch screen panel according to the third embodiment of this document is described below.

Figure 22:
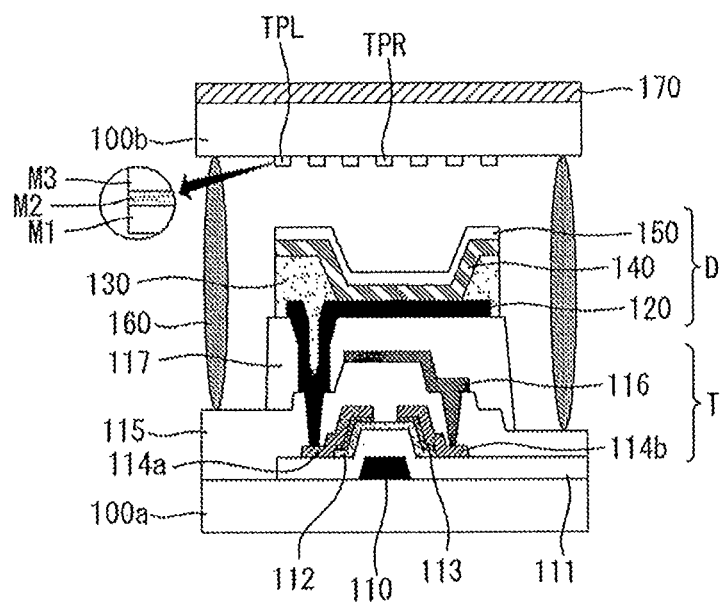
FIGS. 22 and 23 show schematic structures of an organic light emitting diode display device having a capacitive-type touch screen panel built therein according to a third embodiment of this document.
Figure 23:
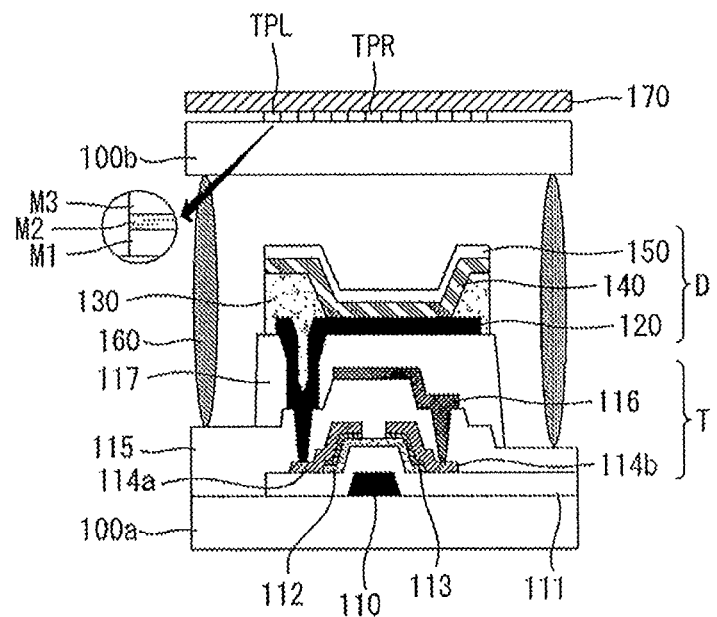

Referring to FIGS. 22 and 23, the panel comprises a subpixel placed between a first substrate 100a and a second substrate 100b. In view of the characteristic of the drawings, the cross section of a driving transistor T and an organic light emitting diode D, from among the elements comprised in the subpixel, is shown in the drawings of the panel. The subpixel comprised in the panel has a similar structure to that shown in FIG. 5, and a description thereof is omitted for simplicity.

For example, in FIG. 22, a touch screen panel comprises the first electrodes TPL and the second electrodes TPR placed on one face of the second substrate 100b (i.e., a face opposite to the subpixel), and it is formed within the panel. Further, a polarization plate 170 may be adhered to the other face of the second substrate 100b. The electrode units TPL and TPR can be patterned to have any one of forms, such as those shown in FIGS. 20 and 21, or other forms and can be placed on one face of the second substrate 100b.

For example, in FIG. 23, a touch screen panel comprises the first electrodes TPL and the second electrodes TEL placed on the other face of the second substrate 100b, and it is formed outside the panel. A polarization plate 170 may be adhered in such a way as to cover the first electrodes TPL and the second electrodes TPR placed on the other face of the second substrate 100*b*. Although not shown, an insulating layer may be placed between the polarization plate 170 and the first and second electrodes TPL and TPR.

The present embodiment illustrates an example in which the capacitive-type touch screen panel is configured within the panel. In the case where the touch screen panel has the capacitive type, the electrodes may be configured to have different patterns so that a change in the capacitances of the first electrodes TPL and the second electrodes TPR is generated.

Figure 24:
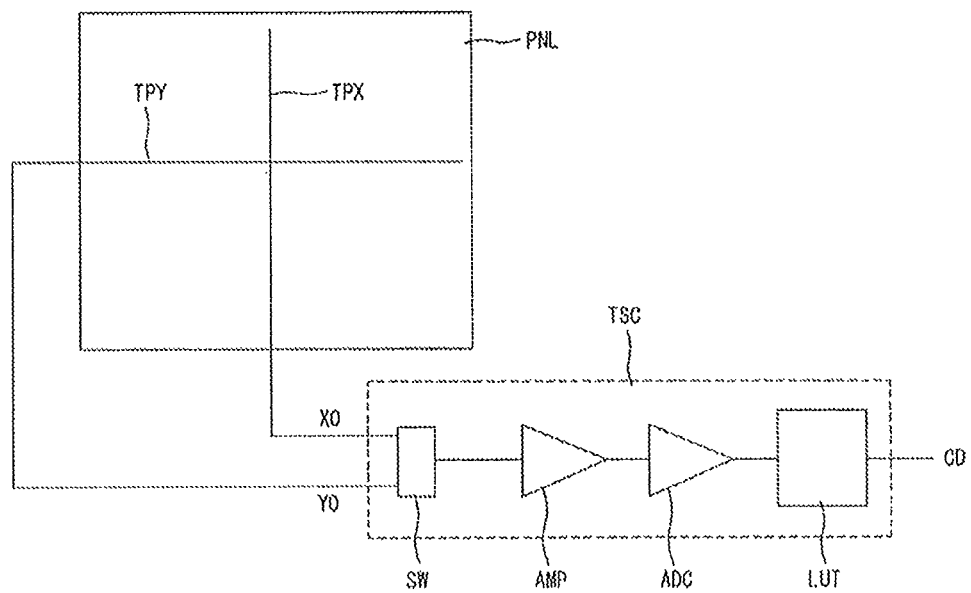
FIG. 24 is a block diagram of the capacitive-type sense unit.

Referring to FIG. 24, the capacitive-type sense unit TSC is coupled to the electrode units TPY and TPX placed within the panel PNL. When a user touches the panel PNL, the sense unit TSC can sense a touched position by recognizing a change in the capacitances of the electrode units TPY and TPX placed within the panel PNL.

For example, the sense unit TSC may comprise a signal input unit SW, a signal amplification unit AMP, a signal conversion unit ADC, and a signal detection unit LUT, but not limited thereto. The signal input unit. SW receives signals through wiring lines Y0 and Y0 coupled to the electrode units TPY and TPX placed within the panel PNL. The signal amplification unit AMP amplifies the signals received from the signal input unit SW. The signal conversion unit ADC converts the inputted analog signals into digital signals. The signal detection unit LUT detects position data by recognizing a change in the capacitance in order to determine which region has been touched by the user based on the digitally converted signals and transfers the detected position data to an apparatus CD.

As described above, the sense unit TSC can detect a touched position by recognizing a change in the capacitances of the electrode units TPY and TPX placed within the panel PNL. The electrode units TPY and TPX may have the following structure.

Figure 25:
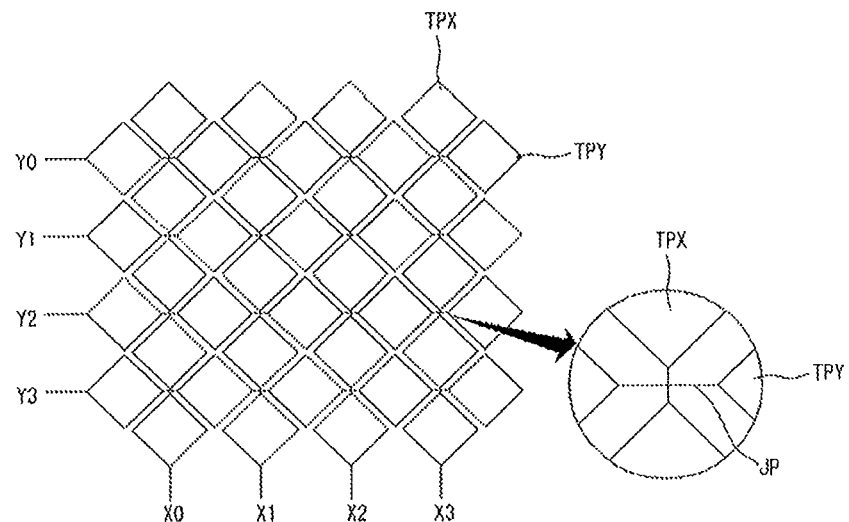
FIG. 25 is an exemplary diagram showing the structure of electrode units placed within the panel.

Referring to FIG. 25, the electrode units TPY and TPX may comprise first electrodes TPY arranged in the Y-axis direction and second electrodes TPX arranged in the X-axis direction. The first electrodes TPY and, the second electrodes TPX are patterned such that they are placed at different layers with an insulating layer DL1 interposed therebetween. The patterned electrodes TPY and TPX can be connected by jumper electrodes JP. FIG. 25 is only illustrative in order to help understanding of the shape of the electrode units TPY and TPX, and this document is not limited to the shape of FIG. 25. Meanwhile, the jumper electrode JP may have a metal oxide/metal/metal oxide structure as in the electrode units TPY and TPX.

Figure 26:
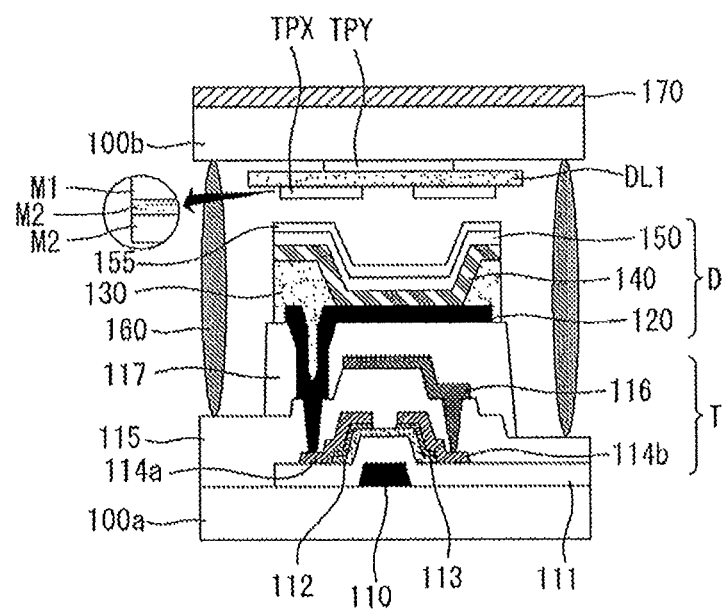
FIGS. 26 and 27 show schematic structures of an organic light emitting diode display device having a capacitive-type touch screen panel built therein according to a third embodiment of this document.
Figure 27:
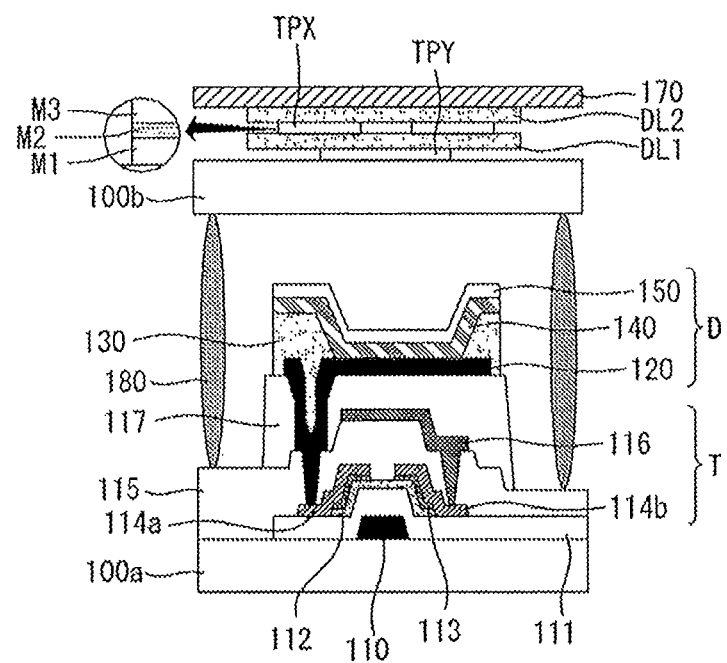

Referring to FIGS. 26 and 27, the panel comprises a subpixel placed between a first substrate 100*a* and a second substrate 100*b*. In view of the characteristic of the drawings, the cross section of a driving transistor T and an organic light emitting diode D, from among the elements comprised in the subpixel, is shown in the drawings of the panel. The subpixel comprised in the panel has a similar structure to that shown in FIG. 5, and a description thereof is omitted for simplicity.

In FIG. 26, a touch screen panel comprises the first electrodes TPY and the second electrodes TPX which are placed on one face of the second substrate 100*b* (i.e., a face opposite to the subpixel) and are placed with the insulating layer DL1 interposed therebetween, and it is formed within the panel. Further, a polarization plate 170 may be adhered to the other face of the second substrate 100*b*. The electrode units TPY and TPX may be patterned in a form, such as that shown in FIG. 25, or other forms and may be placed on one face of the second substrate 100*b*. In such a structure, an interlayer film 155 may be placed on an upper electrode 150 constituting the subpixel in order to prevent a short between the upper electrode 150 and the second electrodes TPX.

In FIG. 27, a touch screen panel comprises the first electrodes TPY and the second electrodes TPX which are placed on the other face of the second substrate 100*b* and are placed with a first insulating layer DL1 interposed therebetween, and it is placed outside the panel. Further, a polarization plate 170 may be adhered such that it covers the first electrodes TPY and the second electrodes TPX placed on the other face of the second substrate 100*b*. In such a structure, a second insulating layer DL2 may be interposed between the polarization plate 170 and the second electrodes TPX.

The present embodiment illustrates an example in which a capacitive-type touch screen panel is configured within the panel. It is however to be noted that a resistive-type touch screen panel may be configured within the panel.

Meanwhile, when the sense unit senses a touched position through the electrode units TPY and TPX placed in the touch screen panel, a sensing time is "τ=RC (resistance, capacitance)". The sensing time becomes fast with a reduction in resistance.

According to the embodiment, at least some of the electrode units TPY and TPX have a structure having a multi-layer made of heterogeneous metals in order to improve the sensing time. In more detail, some or all of each of the electrode units TPY and TPX can have a triple structure made of metal oxide (M1)/metal (M2)/metal oxide (M3). Here, the metal (M2) is relatively more thinly formed than the metal oxides (M1 and M3). When the electrode units TPY and TPX are formed as described above, they can have a high transmissivity in the visible region and can implement a low resistance although the metals are inserted into the electrode units TPY and TPX using the plasmon vacuum effect of metals.

From Table above described in the first or third embodiment, it can be seen that, when each of the electrode units TPY and TPX has the metal oxide (M1)/metal (M2)/metal oxide (M3) structure, light transmissivity and sheet resistance are improved as compared to the comparative example. Accordingly, when the electrode units TPY and TPX have the above structure, an electrical property, an optical property, and a transmission characteristic can be satisfied when fabricating the touch screen panel.

The above-described embodiments are advantageous in that they can provide a display device having a touch screen function capable of reducing a sensing delay time. Further, there is an advantage in that a display device equipped with a touch screen function capable of satisfying an electrical property, an optical property, and a transmission characteristic can be provided.

Although some illustrative embodiments have been described, it should be understood that numerous other modifications and embodiments can be devised by those skilled in the art that will fall within the scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:
1. A display device, comprising:
 a panel configured to comprise subpixels placed in a display region defined in one face of
 a first substrate and a second substrate bonded with the first substrate, the subpixels being covered with an interlayer film;

electrode units configured to comprise first electrodes placed on the interlayer film and second electrodes placed on one face of the second substrate, the subpixels and the one face of the second substrate facing each other; and a sense unit coupled to the electrode units and configured to sense a position through the electrode units, wherein at least some of the electrode units are made of stacked metal oxide, metal and metal oxide sequentially, wherein a thickness of the metal is thinner than that of the metal oxide for improving light transmissivity in the visible region and sheet resistance of the metal oxide.

2. The display device of claim 1, wherein:

the metal oxide comprises any one of tungsten oxide ($WO_3$), molybdnum oxide ($MnO_3$), cerium oxide ($CeO_2$), indium zinc oxide (IZO), tellurium oxide ($TeO_2$), selenium oxide ($SeO_2$), indium tin oxide (ITO), tin oxide ($SnO_2$), and AZO ($Al_2O_3$ doped ZnO), and the metal comprises any one of gold (Au), silver (Ag), aluminum (Al), and copper (Cu).

3. The display device of claim 1, wherein:

one of the first electrodes and the second electrodes is divided and patterned in one direction, and the other of the first electrodes and the second electrodes is formed in common.

* * * * *